United States Patent [19]

Ipri et al.

[11] 4,259,779
[45] Apr. 7, 1981

[54] METHOD OF MAKING RADIATION RESISTANT MOS TRANSISTOR

[75] Inventors: Alfred C. Ipri, Princeton; Doris W. Flatley, Belle Mead, both of N.J.

[73] Assignee: RCA Corporation, New York, N.Y.

[21] Appl. No.: 827,373

[22] Filed: Aug. 24, 1977

[51] Int. Cl.³ .............................................. B01J 17/00
[52] U.S. Cl. ........................................ 29/571; 357/59
[58] Field of Search ............................ 29/571; 359/59

[56] References Cited

U.S. PATENT DOCUMENTS

| | | | |
|---|---|---|---|
| 3,906,620 | 9/1975 | Anzai | 29/571 |
| 4,035,829 | 7/1977 | Ipri | 357/59 |
| 4,075,754 | 2/1978 | Cook | 29/571 |

Primary Examiner—W. C. Tupman
Attorney, Agent, or Firm—Birgit E. Morris; D. S. Cohen; Lawrence P. Benjamin

[57] ABSTRACT

The radiation resistance of an MOS transistor is improved by making the transistor in a manner such that, after the gate insulation layer is formed, all further steps are carried out at a relatively low temperature, i.e., less than about 900° C. The source and drain regions are preferably formed by ion implantation with very little or no post implant thermal activation, and the metallization is applied by low temperature techniques.

8 Claims, 6 Drawing Figures

METHOD OF MAKING RADIATION RESISTANT MOS TRANSISTOR

BACKGROUND OF THE INVENTION

The present invention relates to a method of making MOS transistors, and particularly to such a method which does not adversely affect the radiation resistance of the transistor.

For many uses of MOS transistors it is desirable that the transistor be relatively resistant to dosages of radiation, i.e., the electrical characteristics of the transistor are not adversely affected when the transistor is subjected to radiation. We have discovered that the radiation resistance of an MOS transistor is not only a function of the materials used to make the transistor but is also a function of how it is fabricated. We have found that any processing step which requires treating the transistor at a high temperature, i.e., above about 900° C., after the channel oxide layer has been formed, results in a degradation of the radiation resistance of the transistor. We believe that such heating of the transistor removes the charges formed in the channel oxide layer which in turn results in poor radiation resistance.

SUMMARY OF THE INVENTION

A method of making an MOS transistor wherein, after the channel oxide layer is formed on a semiconductor body, the gate is provided on the channel oxide, impurities are embedded in the semiconductor body on each side of the gate to form the source and drain regions and electrodes are provided on the source and drain regions with all of the steps being carried out at a temperature no greater than 900° C.

DETAILED DESCRIPTION OF THE INVENTION

Figure 1:
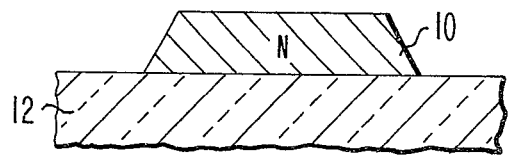
FIGS. 1–6 are cross-sectional views of an MOS transistor illustrating the various steps of one method of the present invention.

Referring to FIG. 1, the method of the present invention starts with a body 10 of a single crystal semiconductor material, such as silicon. As shown, the semiconductor body 10 is an epitaxial layer of single crystal silicon on an insulating substrate 12, such as sapphire. However, the semiconductor body 10 may be a wafer of the semiconductor material or be in any other well known form. The semiconductor body 10 may be of either conductivity type, depending on the type of MOS transistor being made. For this example of the method of the present invention, the semiconductor body 10 is shown as being of N type conductivity.

Figure 2:
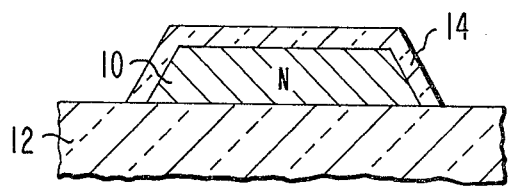

As illustrated in FIG. 2, a channel oxide layer 14 is then formed on the surface of the semiconductor body 10. The channel oxide layer 14 is formed by any of the techniques well known in the art for achieving a radiation tolerant oxide. For example, silicon dioxide can be formed by subjecting the silicon semiconductor body 10 to dry oxygen at 1000° C.

Figure 3:
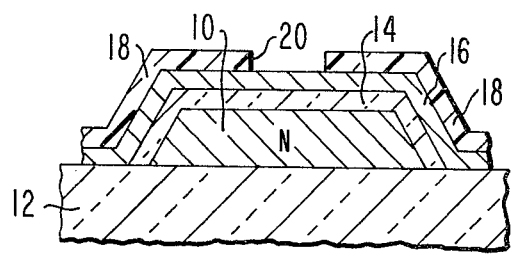

As illustrated in FIG. 3, a layer 16 of doped or undoped polycrystalline silicon is then deposited over the channel oxide layer 14. This may be accomplished by the thermal decomposition of silane ($SiH_4$) diluted with hydrogen with the decomposition being carried out at about 700° C. For an undoped polycrystalline silicon layer 16, a layer 18 of a photoresist material is then coated over the polycrystalline silicon layer 16 and provided with an opening 20 therethrough using standard photolithographic techniques. The region of the polycrystalline silicon layer 16 which is exposed through the opening 20 in the photoresist layer 18 is implanted with boron by standard ion implantation techniques using a dose of $1 \times 10^{16}$ ions per $cm^2$ at an energy of 70 keV. The photoresist layer 18 is then removed with a suitable solvent.

Figure 4:
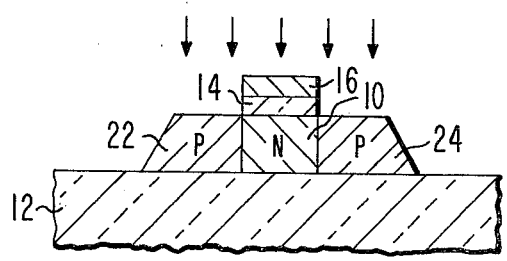

The polycrystalline silicon layer 16 now has a P type region which is highly doped with boron with the remaining portion of the polycrystalline silicon layer being free of or only slightly doped with the boron. As described in U.S. Pat. No. 3,738,880 to A. Laker, issued Jun. 12, 1973, entitled "METHOD OF MAKING A SEMICONDUCTOR DEVICE", there are solvents in which intrinsic silicon is relatively soluble but in which P doped silicon is substantially insoluble. Such solvents include aqueous hydrazine solutions, potassium hydroxide-propanol solutions, and the like. Thus, by subjecting the polycrystalline silicon layer 16 to such a solvent, the undoped or lightly doped portions of the polycrystalline silicon layer will be removed leaving the highly boron doped region as illustrated in FIG. 4. The exposed portions of the channel oxide layer 14 may then be removed, such as with a buffered hydrochloric acid etchant, leaving a portion of the channel oxide layer 14 under the highly doped polycrystalline silicon layer 16 as shown in FIG. 4. The remaining portion of the polycrystalline silicon layer 16 will now act as the gate of the MOS transistor and the remaining portion of the oxide layer 14 will serve as the insulation for the gate.

A dopant is now implanted by standard ion implantation techniques in the exposed portions of the silicon body 10 to form the source and drain regions 22 and 24. For a silicon body 10 of N type conductivity, boron is implanted in the exposed portions of the silicon body to form P type source and drain regions. The boron may be implanted at a dose level of $1 \times 10^{15}$ ions per $cm^2$ and an energy of 70 keV. For a silicon body 10 of P type conductivity, phosphorus may be implanted in the exposed portions of the body to form N type source and drain regions. The phosphorus may be implanted using a dose of $4 \times 10^{15}$ ions per $cm^2$ at an energy of 220 keV. The silicon body 10 may then be heated at a temperature no greater than 900° C. to activate the implanted ions.

Figure 5:
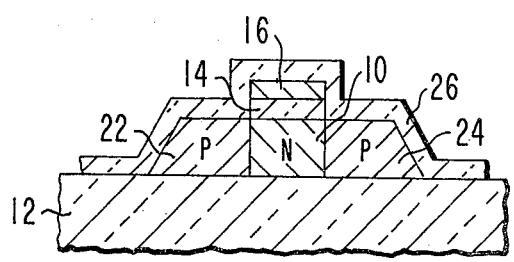
Figure 6:
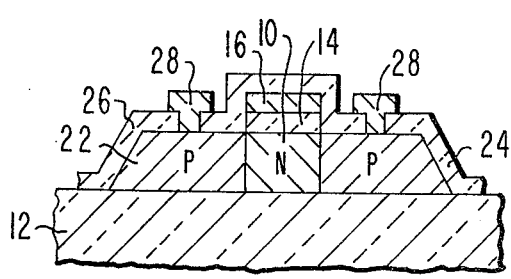

An oxide layer 26, preferably silicon oxide, is then deposited over the source and drain regions 22 and 24 and the gate 16 as shown in FIG. 5. This may be achieved by thermally decomposing silane in oxygen at a temperature of about 350° C. and depositing the resultant oxide on the device. As shown in FIG. 6, openings are then formed in the oxide layer 26 over the source and drain regions 22 and 24, and a contact metal 28 is coated on the oxide layer 26 and in the openings to contact the source and drain regions. The metal areas 28 are preferably deposited by the well known technique of vacuum evaporation and unwanted metal is etched away using well known masking and etching techniques.

Thus, in the method of the present invention, once the channel oxide layer 14 is deposited on the silicon body 10, all further steps of the method are carried out at temperatures no greater than 900° C. and preferably no greater than 800° C. We found that MOS transistors made in accordance with the method of the present invention in which the highest temperature which the transistor is subjected to after channel oxidation is 900° C., had a radiation tolerance of between $1.0 \times 10^5$ and $2.0 \times 10^5$ RAD (Si). By radiation tolerance it is meant that it required this dosage of radiation to induce a two-volt shift in the threshold voltage of the device. MOS transistors made in accordance with the method of the present invention in which the highest temperature to which the transistor was subjected after channel oxidation was 600° C. and 800° C., respectively, had a radiation tolerance in excess of $10^6$ RAD (Si). This radiation tolerance can be compared to MOS transistors made by previously known techniques in which the transistor is subjected to heat treatments in excess of 900° C. after channel oxidation, which were found to have a radiation tolerance of only about $5 \times 10^3$ RAD, (Si). Thus, the method of the present invention improves the radiation tolerance of the MOS transistor.

What is claimed is:

1. In a method of making an improved radiation tolerant MOS transistor which includes the steps of:
   (a) providing a channel oxide layer on a body of semiconductor material,
   (b) providing a gate on the channel oxide,
   (c) embedding a dopant in the semiconductor body on each side of the gate to form the source and drain regions, and
   (d) providing electrodes on the source and drain regions, the improvement comprising carrying out step (a) at a temperature no greater than 1000° C. and steps (b), (c), and (d) at a temperature no greater than 900° C.

2. The method in accordance with claim 1 wherein the dopant is embedded in the semiconductor body by ion implantation.

3. The method in accordance with claim 2 wherein after the dopant is embedded in the semiconductor body, the body is heated at a temperature of no greater than 900° C. to activate the embedded ions.

4. The method in accordance with claim 3 wherein the ion implanted semiconductor body is heated to a temperature of no greater than 800° C. to activate the embedded ions.

5. The method in accordance with claim 1 wherein the gate is formed on the channel oxide by depositing a layer of polycrystalline silicon on the channel oxide and removing portions of the polycrystalline silicon layer to leave the gate portion.

6. The method in accordance with claim 5 in which the polycrystalline silicon layer is deposited by thermally decomposing silane at a temperature of no greater than 900° C.

7. The method in accordance with claim 6 wherein the portion of the polycrystalline silicon layer which is to form the gate is embedded with a dopant at a temperature no greater than 900° C. and the portion of the polycrystalline silicon layer which is not so embedded is then removed.

8. The method in accordance with claim 7 wherein the dopant is embedded in the polycrystalline silicon layer by ion implantation.

* * * * *